(12) United States Patent
Clarke (10) Patent No.: US 6,830,664 B2
(45) Date of Patent: Dec. 14, 2004

(54) CLUSTER TOOL WITH A HOLLOW CATHODE ARRAY

(75) Inventor: Andrew P. Clarke, Santa Barbara, CA (US)

(73) Assignee: Tegal Corporation, Petaluma, CA (US)

( * ) Notice: Subject to any disclaimer, the term of this patent is extended or adjusted under 35 U.S.C. 154(b) by 66 days.

(21) Appl. No.: 10/212,293

(22) Filed: Aug. 5, 2002

(65) Prior Publication Data

US 2004/0060817 A1 Apr. 1, 2004

(51) Int. Cl.[7] .............................................. C23C 14/35
(52) U.S. Cl. ........................ 204/192.12; 204/298.07; 204/298.12; 204/298.17; 204/298.18; 204/298.19; 204/298.25
(58) Field of Search ................... 204/192.12, 298.07, 204/298.12, 298.13, 298.16, 298.17, 298.18, 298.19, 298.25

(56) References Cited

U.S. PATENT DOCUMENTS

| | | | |
|---|---|---|---|
| 3,616,450 A | 10/1971 | Clark ........................... 204/298 |
| 4,401,546 A | 8/1983 | Nakamura et al. ............ 204/298 |
| 4,588,490 A | 5/1986 | Cuomo et al. ................ 204/298 |
| 4,825,808 A | * 5/1989 | Takahashi et al. ............ 118/719 |
| 4,915,810 A | 4/1990 | Kestigian et al. ............ 204/298.04 |
| 4,943,361 A | * 7/1990 | Kakehi et al. ............ 204/192.32 |
| 4,988,424 A | 1/1991 | Woodward et al. ........ 204/192.29 |
| 5,334,302 A | * 8/1994 | Kubo et al. ............ 204/298.18 |
| 5,482,611 A | 1/1996 | Helmer et al. ............ 204/298.17 |
| 5,517,084 A | 5/1996 | Leung ..................... 315/111.81 |
| 5,627,435 A | 5/1997 | Jansen et al. ............. 315/111.21 |
| 6,079,355 A | 6/2000 | Lou et al. ................. 118/723 E |
| 6,110,556 A | 8/2000 | Bang et al. ................. 428/64.1 |
| 6,118,218 A | 9/2000 | Yializis et al. ........... 315/111.21 |
| 6,237,528 B1 | 5/2001 | Szapucki et al. ......... 118/723 E |
| 6,238,526 B1 | * 5/2001 | Maishev et al. ........ 204/192.11 |
| 6,245,190 B1 | 6/2001 | Masuda et al. ............. 156/345 |
| 6,277,249 B1 | 8/2001 | Gopalraja et al. ...... 204/192.12 |
| 6,312,574 B1 | 11/2001 | Quaderer et al. ....... 204/298.17 |
| 6,390,020 B1 | 5/2002 | Hu et al. ..................... 118/723 |
| 6,412,437 B1 | 7/2002 | Campbell et al. ......... 118/723 E |
| 6,415,736 B1 | 7/2002 | Hao et al. ................... 118/723 |
| 2001/0015175 A1 | 8/2001 | Masuda et al. ............. 118/723 |

FOREIGN PATENT DOCUMENTS

JP          2001-226768         *  8/2001

* cited by examiner

*Primary Examiner*—Rodney G. McDonald
(74) *Attorney, Agent, or Firm*—Kenneth J. Hovet (57) ABSTRACT

A cathode for a cluster tool in accordance with the present invention includes a base, a disc-shaped target mounted to the base and a magnetic source for establishing magnetic flux lines through the target. The target further comprises a top plate with a plurality of through holes; and a bottom plate with a plurality of bottom plate openings which interconnect distribution grooves formed in one surface with base face channels formed in the other surface. When the top plate is mated to the bottom plate, a path of fluid communication is established from the base face channels to the through holes to allow for inert gas to pass through the target. During operation, the through holes act as micro-cathodes to more efficiently cause material to be sputtered from the target. Each through hole defines a through hole axis, and the magnetic flux lines are parallel with the through holes axes. This ensures the sputtered material from the hollow cathode leaves the target and impinges on a flat, spaced-apart substrate at a normal angle.

21 Claims, 6 Drawing Sheets

CLUSTER TOOL WITH A HOLLOW CATHODE ARRAY

FIELD OF THE INVENTION

The present invention pertains generally to cluster tools. More particularly, the present invention pertains to cluster tools having a cathode for coating flat substrates with an extremely thin layer of metal particles. The present invention is particularly, but not exclusively, useful as a cluster tool having a cathode with an array of openings, for achieving a uniform directional deposition of metal particles in order to fill high aspect ratio or extremely narrow trenches on a substrate.

BACKGROUND OF THE INVENTION

Cluster tools are well known in the prior art for placement of an extremely thin film of metal on a flat substrate, such as a wafer. To do this, an electrodeposition or a physical vapor deposition process is used wherein a sputtering cathode deposits metal particles on the substrate in a manner known in the art. These processes are also used for the filling of "trenches" that are formed in the substrate surface.

Usually, because of the extremely high voltages involved in the electrodeposition process, it is desired to use the physical vapor deposition process to coat a wafer with metal. This is feasible in cases where the trench width is not too small (approximately 1.0 $\mu$m), or where the aspect ratio (ratio of desired depth to width of the trench) is not too high. However, it is often desired to fill 0.1 $\mu$m wide trenches on a wafer, as well as high aspect ratio (very deep) trenches. Currently, filling such a trench with a metal layer such as Cu is problematic and requires using an electrodeposition method. What is desired is a PVD method that allows for filling of high aspect ratio trenches and trenches as narrow as 0.1 $\mu$m wide.

It is known in the prior art the PVD processes use a magnetic field as a catalyst to cause the sputtering process to take place. Further, to fill a high aspect ratio trench, prior art devices have attempted to manipulate the magnetic field by increasing the intensity of the magnetic field. This increases the amount of metal particles which hit the flat substrate, which theoretically would increase the likelihood that high aspect or narrow trenches would become filled with metal particles. In practice, however, the high intensity magnetic field causes sputtered metal particles to impinge the substrate surface at an angle, which further tends to block the entrance to the trench and prevents any substantive filling of the trench. It would be much more effective to devise a device which would cause sputtering of the cathode target so that the particles of the cathode target impinge the substrate at an angle normal to the substrate surface.

U.S. Pat. No. 5,482,611, which issued, which issued to Helmer for an invention entitled "Physical Vapor Deposition Employing Ion Extraction From A Plasma", describes a hollow cathode magnetron for producing intense plasma in a cathode container which ionizes a substantial percentage of sputter cathode (target) material. In Helmer, however, the magnetic trap is formed within the cathode container, which further effectively traps energetic electrons in a closed-loop magnetic tunnel with electrostatically reflective sidewalls. This requires a magnetron-assisted hollow cathode structure; otherwise, an undesirably high voltage will be required to operate the cathode.

In light of the above, it is an object of the present invention to provide a cluster tool with a sputtering cathode which can fill extremely narrow and high aspect ratio trenches on a flat substrate. It is another object of the present invention to provide a sputtering cathode which uses a PVD process to fill narrow manufacturing nodes and high aspect ratio trenches without the requirement of an initial seed layer. Yet another object of the present invention is to provide a sputtering cathode which can fill manufacturing nodes and high aspect ratio trenches without requiring an electrodeposition process. Another object of the present invention is to provide a sputtering target for a cluster tool which creates the effect of an array of hollow cathodes to achieve intense, yet uniform plasma without requiring an increase in the intensity of the magnetic field surrounding the cathode. It is another object of the present invention to provide a sputtering cathode for a cluster which is easy to manufacture and which can be used in a cost-efficient manner.

SUMMARY OF THE INVENTION

A cluster tool with a hollow cathode array in accordance with the present invention includes a base, a target and a source of magnetic flux lines. The base is formed with a recess, and the target is preferably disc-shaped with a substrate face and a base face and is shaped to interfit with the recess. The target is placed within the base recess so that the substrate face is oriented towards a spaced-apart flat substrate (usually a wafer), while the opposite face is in thermal contact with the base. Since the base is actively cooled via internal cooling lines, this allows heat removal from the target during operation of the cathode.

The base is formed with an inert gas feedhole, and the target is formed with a plurality of gas communication paths which extend through the target from the substrate face to the base face. The gas communication paths allow for inert gas to pass through the target during operation of the device.

To further distribute the inert gas more equally, the target can be subdivided into a top plate and a bottom plate. The top plate is formed with a plurality of through holes which extend through the plate. The bottom plate is formed with a plurality of distribution grooves on one side and with base face channels on the side which define the base face of the target. The bottom plate further includes a plurality of bottom plate openings which interconnect the base face channels in fluid communication with the distribution grooves (Alternatively, the bottom plate can be notched around the periphery thereof to connect the base face channels with the distribution grooves). When the top plate is placed on the bottom plate to establish the target, the through holes of the top plate combine with the distribution grooves, bottom plate openings and base face channels to establish the gas communication paths through the overall target. The above arrangement of the top plate and bottom plate allows for more even distribution of the inert gas through the target during operation of the device of the present invention.

The geometry of through holes in the top is selectively determined. More specifically, the maximum height of the through holes (which is equal to the thickness of the top plate) must be at least twice that of the maximum width of the through holes. Also, the through holes are preferably oriented normal to the substrate face of the top plate, but the through holes can be oriented so that they form an angle of up to forth-five degrees with the substrate face.

The magnetic source is preferably mounted to the underside of the base to ensure that the magnetic flux lines pass through the device of the present invention normal to the target. The magnetic flux lines passing through the target are parallel with the axes defined by each respect through hole. With this configuration, the magnetic lines of flux "guide" material that is sputtered from the through holes out of the through holes and causes the sputtered material to impinge on the substrate normal to the substrate. This further allows for more effectively of narrow width trenches during a deposition process.

BRIEF DESCRIPTION OF THE DRAWINGS

The following invention will be best understood from the drawings, in which similarly-referenced characters refer to similarly-referenced parts, and in which.

WRITTEN DESCRIPTION OF THE PREFERRED EMBODIMENTS

Referring now to the Figures, the hollow cathode array for a cluster tool is shown and is generally designated by reference character 10. In brief overview, the invention comprises a base 12, a target 13 and a magnetic source 15. The base, target and magnetic source cooperate to cause sputtered material from the target to coat a flat substrate 17, such as a silicon wafer. The manner in which this occurs is described more fully below.

The base comprises a body 14 that extends upwardly from a support stand 16. The body is bounded by an outer wall 18 that merges upwardly into a beveled shoulder 20, which is beveled so that it slopes radially inward from outer wall 18. The beveled ledge further merges into a flat, annular base top edge 22.

Figure 1:
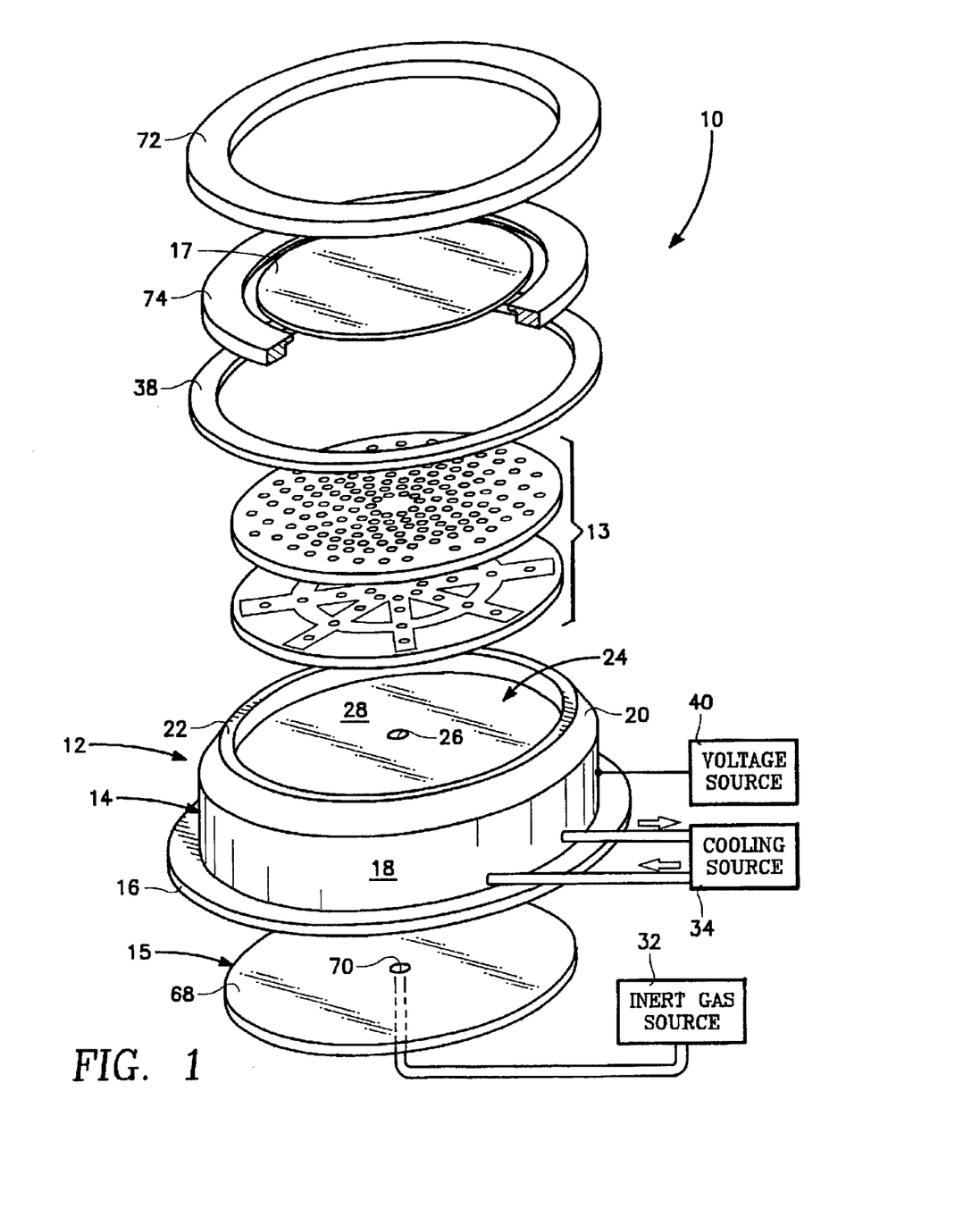
FIG. 1 is an exploded isometric view of the cathode of the present invention.
Figure 2:
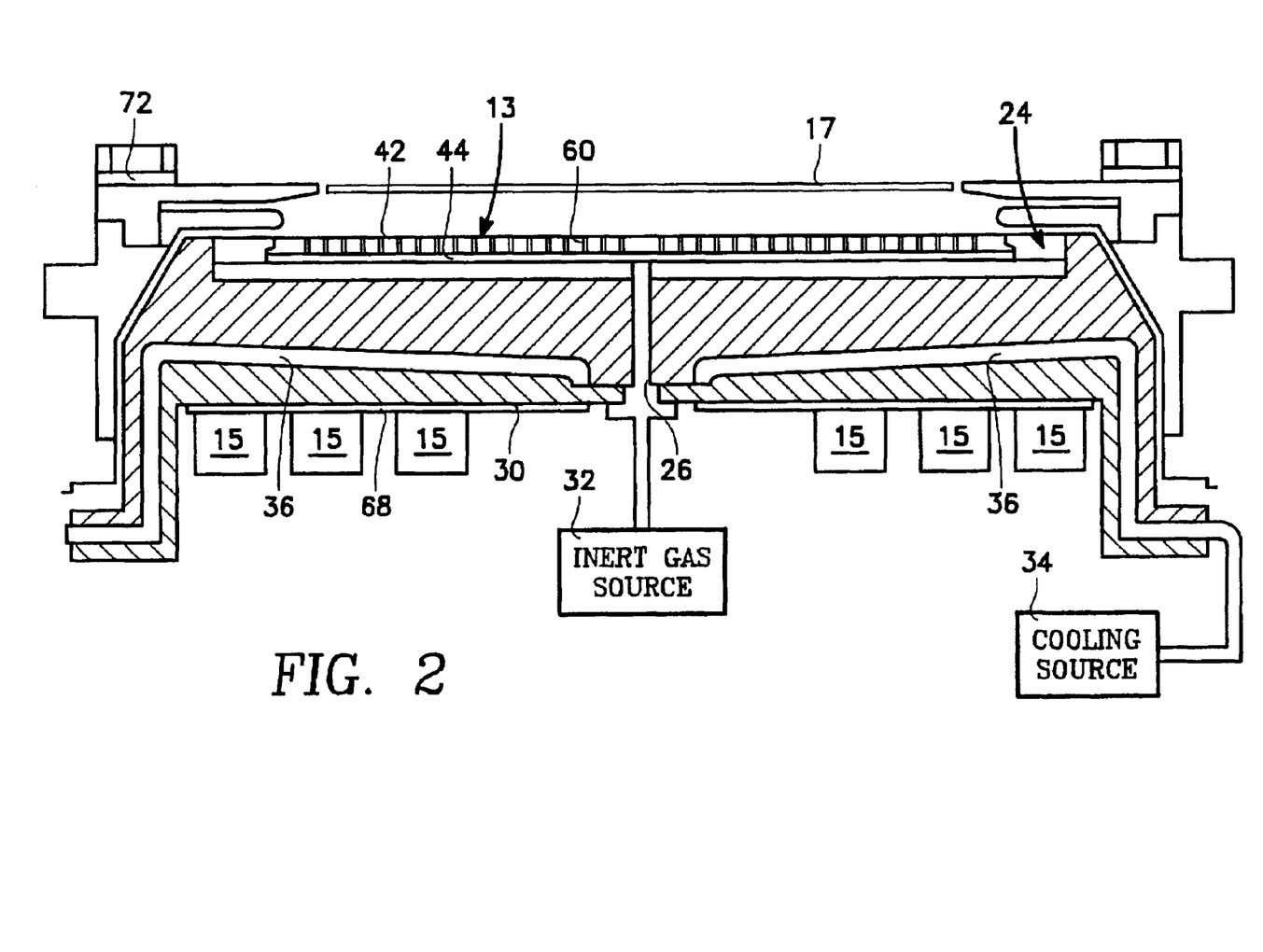
FIG. 2 is a cross-sectional view of the cathode of FIG. 1.
Figure 5:
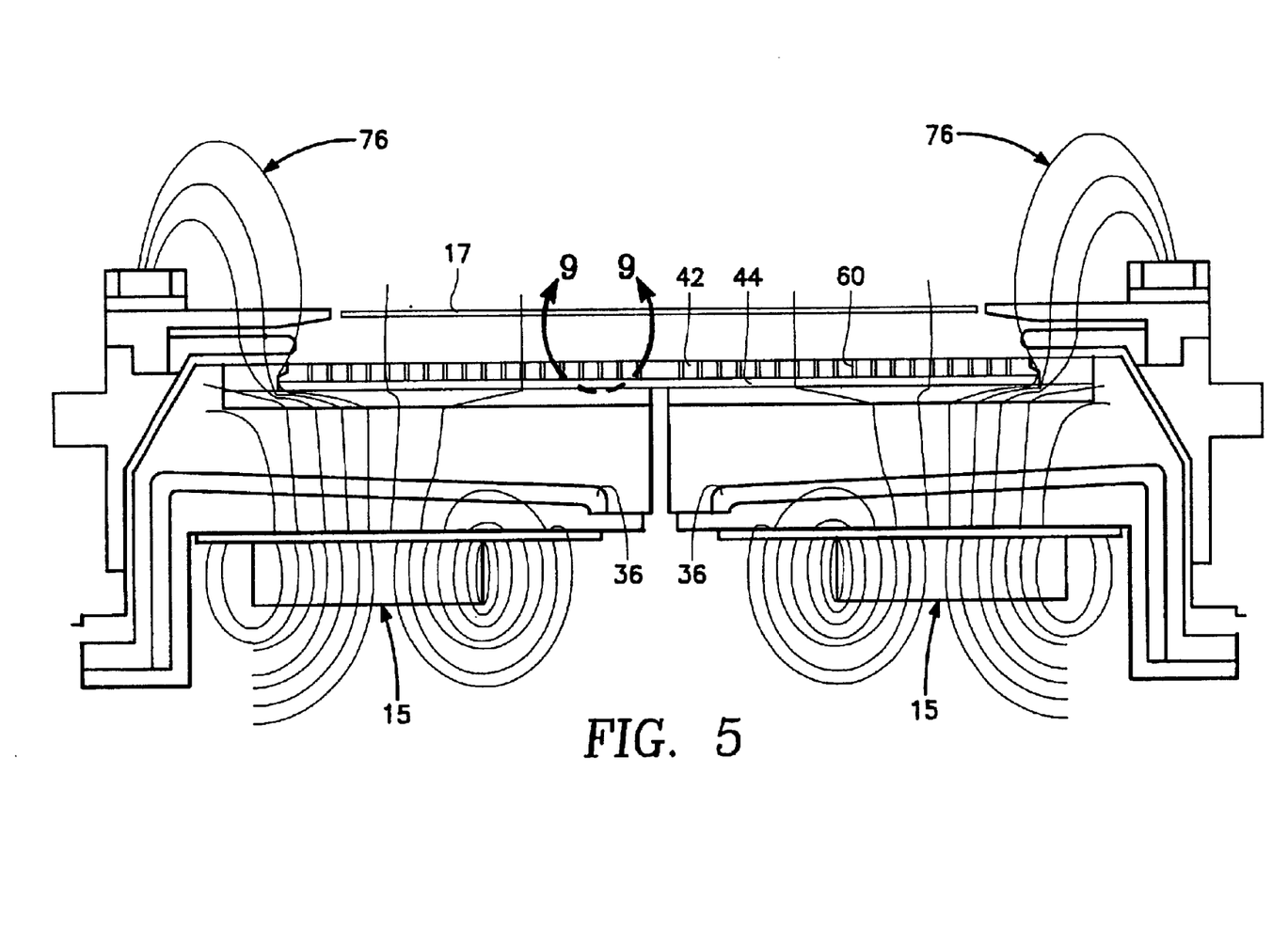
FIG. 5 is the same view of FIG. 2, which further shows the interaction of the magnetic field with the cathode during operation thereof.

A target recess 24 extends downwardly into the body from base top edge 22 and terminates at a horizontal recess surface 28, as shown in FIGS. 1–2 and 5. The target shape conforms to the shape of the target recess, and the recess is slightly convex. This allows target 13 to be placed into the target recess 24 in a manner which ensures good thermal contact between the target and the recess surface 28. The thermal contact further ensures effective heat removal from the target through the cathode base during operation of the cathode.

An inert gas feedhole 26 is formed in the base. The inert gas feedhole extends vertically through the base, from recess surface 28 to the underside 30 of the body (See FIGS. 2 and 5). An inert gas source 32 is connected in fluid communication with the inert gas opening through the underside 30, as depicted schematically in FIGS. 1 and 2. During operation of the cathode, inert gas supplied from inert gas source 32 travels through the base and contacts the target which has been placed in the target recess.

The body and support stand are actively cooled. To do this, a cooling medium is circulated from a cooling water source 34 to a cooling water channel 36 that is located within the base, as best seen in FIGS. 2 and 5. The cooling water channel extends radially outward from proximate the inert gas feedhole, and further extends around the periphery of the body. From the body, the cooling water channel extends downwardly into the stand, then radially outward therefrom, and further returns back to the cooling water source 34 in a manner known in the prior art. As mentioned above, this allows for the removal of thermal energy from the cathode (and target) during operation. It is to be appreciated, however, that other arrangements for cooling the cathodes (and target, when placed in the target recess) known in the art are envisioned without departing from the scope of the present invention.

A voltage source 40 is electrically attached to the cathode for in a manner known in the art for providing a voltage potential to the cathode, in order to facilitate the deposition process for coating substrate 17.

Preferably, the base is machined from 1018 steel. However, it is to be appreciated that other materials are envisioned without departing from the scope of the present invention. The primary consideration is that the material must have sufficient hardness so that there is no unwanted flexure of the base (such as bowing, for example) under the extreme vacuum conditions associated with a deposition process.

Referring now primarily to FIGS. 3–4 and 6–8, the structure of the target is shown in greater detail. The target comprises a top plate 42 and a bottom plate 44. Both the top plate and the bottom plate are somewhat disc-shaped, with the bottom plate preferably having a greater thickness than the top plate. When placed so that they contact each other, the top plate and the bottom plate cooperate to establish a plurality of gas communication paths through the target, as indicated by arrow 62 in FIG. 6. These gas communication paths allow for inert gas flow from the inert gas feedhole 26 to pass through the target during operation of the cathode, to allow the deposition process to take place.

Figure 3:
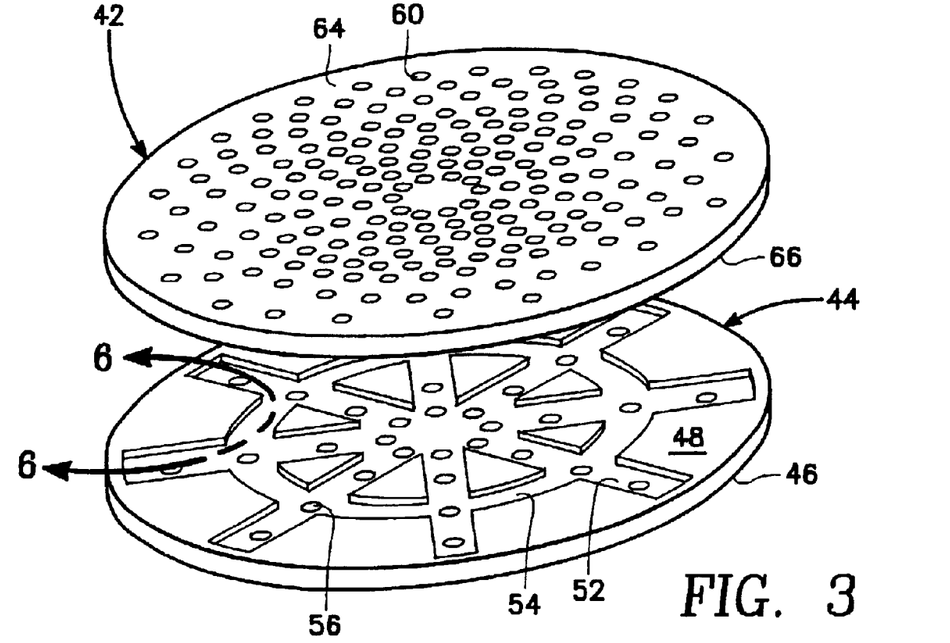
FIG. 3 is an enlarged isometric view of the target of the cathode of FIG. 1.
Figure 6:
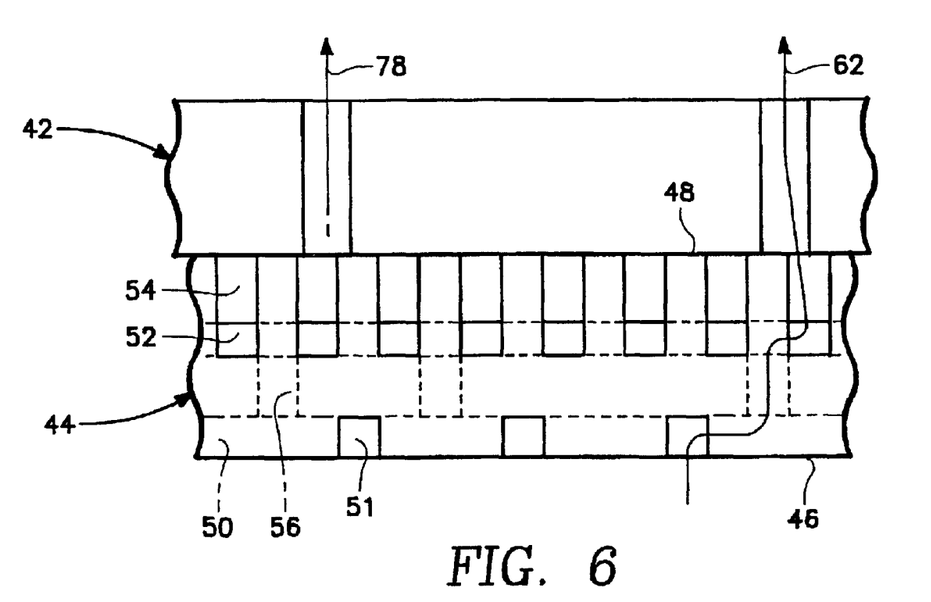
FIG. 6 is a cross-sectional view taken along line 6—6 in FIG. 3

The bottom plate includes a base face 46 and an opposing bottom plate mating surface 48. The bottom plate mating surface 48 is formed with a plurality of radial distribution grooves 52 that extend radially outward from proximate the geometric center of the bottom plate to the periphery thereof. The radial distribution grooves merges into a plurality of concentric circumferential distribution grooves 54, as shown in FIGS. 3 and 6 (For clarity, only one circumferential groove 54 in shown in FIG. 3). The radial distribution grooves and circumferential distribution grooves allow for even distribution of inert gas over the bottom plate mating surface 48.

The structure of the base face 46 is similar to that of bottom plate mating surface 48. Specifically, a plurality of concentric circumferential base face channels 51 are formed in the base face, and the circumferential base face channels 51 are connected in fluid communication with a plurality of radial channels 50 that are formed in the base face so that they extend outwardly from the geometric center of the bottom plate. To allow for inert gas to flow through the bottom plate in order to reach the top plate, the distribution grooves 52, 54 and base face channels 50, 51 are interconnected by a plurality of bottom plate openings 56, as best seen in FIG. 3.

Figure 4:
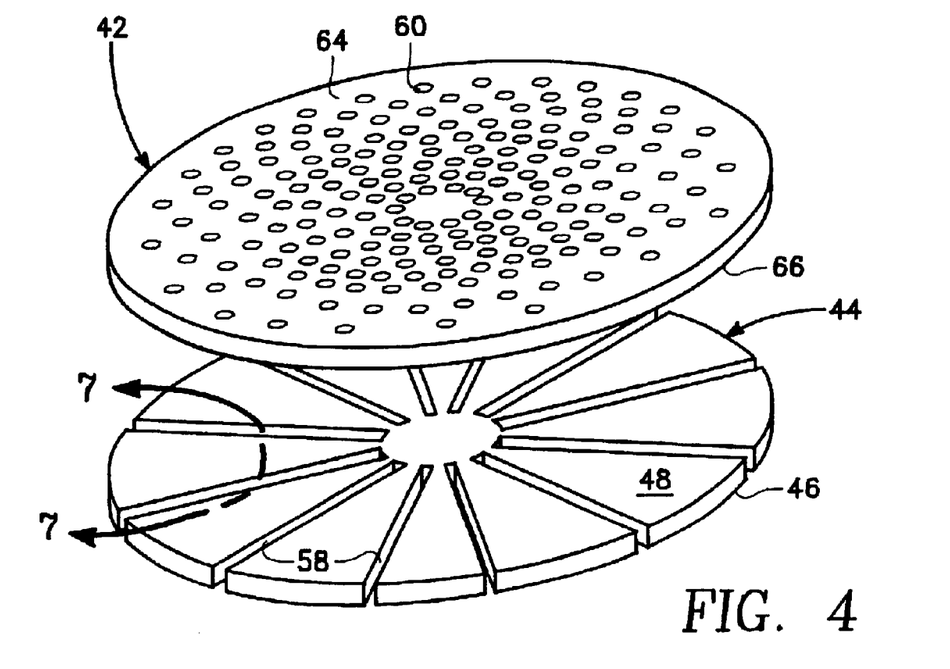
FIG. 4 is an alternative embodiment of the target of FIG. 3.

In an alternative embodiment of the present invention, the bottom plate is formed with a plurality of radial slots 58, as shown in FIG. 4. The radial slots extend form proximate the geometric center of the base face and terminate at the periphery of the bottom plate. This alternative embodiment also provides for passage of inert gas through the bottom plate for even distribution over the bottom plate mating surface. Further, it is to be appreciated that the size and/or geometry of any number of similar channels/slots are envisioned by the cathode of the present invention. That is, any geometric opening in the bottom plate can be used, provided the gas openings allow for inert gas to pass through the bottom plate and be evenly distributed between the bottom plate and the top plate of the target.

The top plate includes a substrate face 64 and an underlying top plate mating surface 66. The top plate is further formed with a plurality of through holes 60 that extend from substrate face 64 to top plate mating surface 66. The through holes are distributed on the top plate at a relative distance so that they are far enough away from one another so as to support a homogeneous glow discharge of particles, yet close enough to avoid an imaging effect from adjacent through holes. Each through hole defines a through hole axis 78, as perhaps best seen in FIGS. 6 and 9. During operation, each through hole functions as a miniature hollow cathode as recited below to augment the deposition process.

Figure 7:
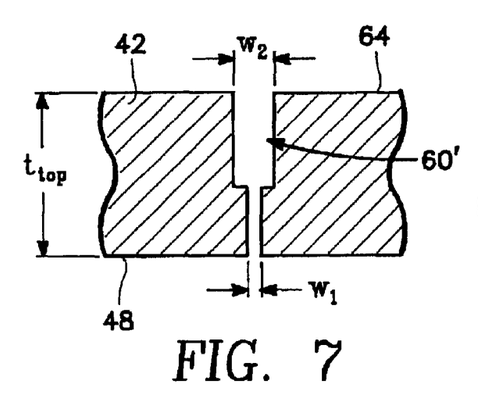
FIG. 7 is an alternative embodiment for the through holes shown in FIG. 6.
Figure 8:
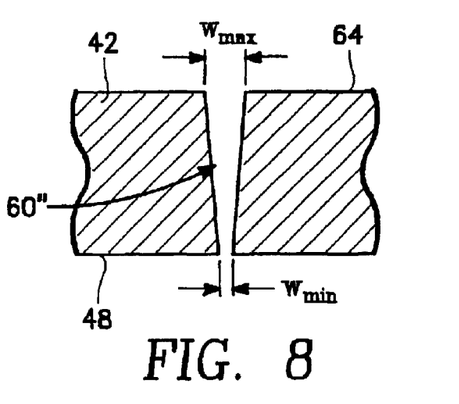
FIG. 8 is a second alternative embodiment for the through holes shown in FIG. 6.

FIGS. 7 and 8 demonstrate alternative embodiments of the through holes of the present invention. Specifically, FIG. 7 demonstrates an embodiment wherein the through hole 60' has a constant first width $w_1$ at top plate mating surface 66 that abruptly widens into constant second width $w_2$ at substrate face 64. Alternatively, FIG. 9 demonstrates a configuration wherein through hole 60" has a frustro-conical configuration and a gradual increasing taper from a minimum width $w_{min}$ at top plate mating surface 64 to a maximum width $w_{max}$ at substrate face 64 of the top plate. It is to be appreciated, however, that other configurations are envisioned for the through holes, provided the thickness $t_{top}$ of the top plate (which is equal to the height of the through holes) is at least twice the maximum width of the through hole.

For assembly, the top plate is mated to the bottom plate to establish target 13. As best seen in FIGS. 3–4 and 6, when the top plate mating surface 66 of top plate 42 contacts the bottom plate mating surface 48 of bottom plate 44, the base face channels 50, 51, bottom plate openings 56, distribution grooves 52, 54 and through holes 60 combine to establish the aforementioned gas communication paths 62 through the target.

Once the top plate and bottom plate are mated together and placed within target recess 28, the target 13 must be fixed to the cathode. To do this, and referring again primarily to FIGS. 1, 2 and 5, an annular clamp ring 38 is placed around the periphery of the target and selectively fixed to the base annular top edge of the base. A future embodiment of the present invention is envisioned, wherein the clamp ring 38 and target are selectively removed in a remote manner (via robotics), to allow for automated replacement of a depleted target.

As mentioned above, the cathode of the present invention incorporates a magnetic source 15. The magnetic source comprises primarily a disc magnet 68. The disc magnet is attached to underside 30 of the body and has a center hole 70 to allow for passage of inert gas therethrough. To further augment the magnetic field around the cathode, the magnetic source further includes a ring magnet 72. The ring magnet is placed above the substrate holder 74 and fixed thereto. The ring magnet has an annular shape so as not to interfere with any automated placement and/or removal of the substrate during operation of the device.

The magnetic source is placed on the cathode to selectively orient magnetic flux lines 76 normal to the substrate face 64 of the target. Since the substrate is parallel to the target, the flux lines 76 are also normal to substrate 17. By referring to Figures, it can also be seen that the magnetic flux lines are also parallel to each respective through hole axis. The magnetic flux lines serve several functions. Specifically, they are as guiding centers for sputtered ions 80 during the deposition process (See FIG. 9, note that the particles are actually molecular in size and are not to scale in FIG. 9). The magnetic flux lines also enhance the directionality of metal ions that are sputtered from the top plate during the deposition process.

In the preferred embodiment, and as shown in FIG. 6, the through holes are formed in the top plate of the target so that the axes and magnetic flux lines are normal to the substrate face 64 and base face 46. It is to be appreciated, however, that alternative embodiments are envisioned wherein the through holes are formed in the top plate so that the through hole axes are oriented at an angle with a range of forty-five to ninety degrees (45° to 90°) with respect to the plane containing the substrate face.

Figure 9:
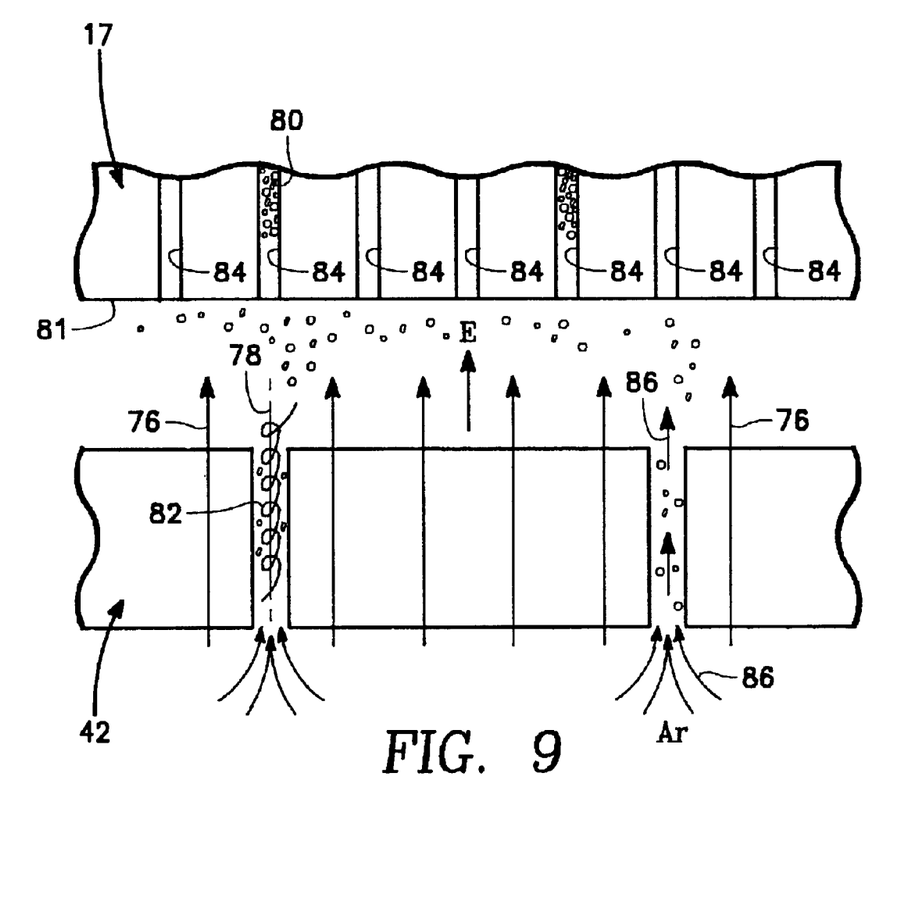
FIG. 9 is a cross-sectional view taken along line 9—9 in FIG. 5.

During operation of the device, the voltage source is activated to establish a voltage potential on the cathode, as indicated by arrow E in FIG. 9. Simultaneously, the pressurized inert gas source provides an inert gas such as Argon through the inert gas feedhole of the base. From the inert gas feedhole, the gas expands and spreads via the base face channels 50, 51 and passes through the bottom through the bottom plate openings 56. The gas becomes evenly distributed between the top plate and the bottom plate via distribution grooves 52, 54. The gas then passes through the top plate via through holes 60. As the gas passes therethrough, each through hole acts as a miniature cathode and target material is sputtered from the through hole and deposed onto the substrate 17 as depicted by ion 80 in FIG. 9.

While the above events are occurring, the magnetic source causes magnetic flux lines to pass through the bottom plate (and more importantly, the top plate). Because the magnetic flux lines are oriented orthogonally to substrate face 64 and substrate 17 as discussed above, the sputtered material (which is metallic) is guided by the magnetic flux lines 76 and follows a path depicted by corkscrew path 82 in FIG. 9. The ions continue away from to plate 42 until they impinge normally onto substrate surface 81. Because the sputtered ions impinge the substrate normal to the substrate surface, the ions are not deposited on the sidewalls of substrate trenches 84, but rather directly into the substrate trenches to completely fill the trench. This allows form substrate trenches having a width as low as 0.1 μm and/or trenches with high aspect ratios (very deep trenches) on substrate 13 can be effectively filled via a PVD process, which further improves the quality of the overall finished substrate and increased flexibility in how the wafer is processed.

While the methods and system of the present invention are indicative of the preferred embodiments, it is to be appreciated that they are merely illustrative of the invention, and are not intended to be limiting. Accordingly, no limitations are envisioned by the present invention other than those cited in the appended claims.

What is claimed is:

1. A device for coating a flat substrate comprising:
   a cathode base having a horizontal surface;
   a target comprising a planar top plate having a substrate face, a base face in thermal contact with said horizontal surface, and a plurality of normal through holes formed within said top plate and extending therethrough;
   a substrate holder for positioning a planar substrate spaced apart from and parallel to the target; and,
   a means for establishing open loop magnetic flux lines passing through said target about normal to said substrate face and longitudinal to said through holes.

2. The device of claim 1 wherein said top plate has an upper surface defining said substrate face and a top underside defining a top plate mating surface; and,
   wherein said target further comprises a bottom plate having a bottom plate mating surface in contact with said top plate mating surface face and a bottom underside defining said base face, and further having a plurality of lower plate openings extending from said bottom plate mating surface to said base face. said through holes and said lower plate openings together defining a plurality of gas communication oaths formed within said target extending therethrough from said base face to said substrate face.

3. The device of claim 1 further comprising a clamping ring selectively attached to said base for releasably fixing said target between said clamping ring and said base.

4. The device of claim 1 wherein said through holes have a maximum width and a height that is at least twice that of said maximum width.

5. The device of claim 1 wherein said means for establishing open loop magnetic flux lines includes a disk magnet positioned below said target and a ring magnet positioned above said substrate holder and parallel to said target.

6. A device for coating a flat substrate comprising:
   a base;
   a target having a substrate face, a base face in thermal contact with said base; and
   a plurality of gas communication paths formed within said target and extending therethrough from said base face to said substrate face; and,
   a means for establishing magnetic flux lines passing through said target about normal to said substrate face, said target including:
   a top plate having an upper surface defining said substrate face and a top underside defining a top plate matins surface and further having a plurality of through holes extending from said substrate face to said top plate mating surface; and,
   a bottom plate having a bottom plate mating surface in contact with said top plate mating surface, wherein said bottom plate mating surface includes a plurality of distribution grooves and, a bottom underside defining said base face, and further having a plurality of plate openings extending from said bottom plate mating surface to said base face, wherein said base face is formed with a plurality of base face channels, said bottom plate openings connecting said distribution grooves in fluid communication with said base face channels,
   whereby said through holes, said distribution grooves, said lower plate openings, and said base face channels together define said gas communication paths.

7. The device of claim 6 where said base includes an inert gas feedhole in fluid communication with said base face channels.

8. The device of claim 6 wherein each through hole defines a respective through hole axis and said magnetic flux lines are parallel to said through hole axis.

9. The device of claim 6 wherein through hole axes are selectively oriented to establish an angle of forty-five degrees to ninety degrees between each through hole axis and said substrate face.

10. A cluster tool having a cathode comprising: a target comprising a planar top plate formed with a plurality of target through holes extending therethrough, each through hole defining a through hole axis and establishing a microcathode within said target during operation thereof; and, a means for creating open loop magnetic lines of flux parallel to said through hole axes.

11. The cluster tool of claim 10 further comprising a base having a recess for receiving target.

12. The device of claim 10 wherein said top plate has an upper surface defining a substrate face and a top underside defining a top plate mating surface; and,
    wherein said target further comprises a bottom plate having an bottom plate mating surface in contact with said top plate mating surface and a bottom underside defining abase face, and further having a plurality of lower plate openings extending from said bottom plate mating surface to said base face, said through holes and said lower plate openings together defining a plurality of gas communication paths formed within said target extending therethrough from said base face to said substrate face.

13. The device claim 12 wherein said bottom plate mating surface includes a plurality of distribution grooves in fluid communication with said through holes and wherein said base face is formed with a plurality of base face channels, said lower layer openings connecting said distribution grooves in fluid communication with said base face channels.

14. The device of claim 10 wherein said means for establishing open loop magnetic flux lines includes a disk magnet positioned below said target and a ring magnet positioned above said substrate holder and parallel to said target.

15. A method for coating a flat substrate comprising the steps of:
    A) providing a cathode base;
    B) supplying a target;
    C) placing said target in thermal contact with said cathode base;
    D) forming a plurality of gas communication paths extending through said target; and,
    E) superimposing open loop magnetic lines of flux normal to said target.

16. The method of claim 15 wherein said base is formed with an inert gas feedhole and further including the step of:
    F) injecting an inert gas through said feedhole onto said target.

17. The method of claim 15 wherein step D) further comprises the steps of:
    G) dividing said target into a top plate and a bottom plate
    H) forming through holes in said top plate
    I) creating bottom plate openings in said bottom plate, said bottom plate openings and said through holes cooperating to define gas communication paths.

18. The method of claim 17 wherein each said through hole defines a through hole axis, and further wherein said magnetic flux lines are parallel with said through hole axes.

19. A device for coating a flat substrate comprising:

a base;

a target having a substrate face and a base face, said base face in thermal contact with said base;

a plurality of gas communication paths formed within said target and extending therethrough from said base face to said substrate face; and, a means for establishing magnetic flux lines passing through said target about normal to said substrate face, said target including:

a top plate having an upper surface defining said substrate face and a top underside defining a top plate mating surface and further having a plurality of through holes extending from said substrate face to said top plate mating surface; and, a bottom plate having a bottom plate mating surface in contact with said top plate mating surface, a bottom underside defining said base face, and further having a plurality of grooves extending from said bottom plate mating surface to said base face, whereby said through holes and said grooves together defining said plurality of gas communication paths.

20. The device of claim 19 wherein each through hole defines a respective through hole axis are parallel to said through hole axis.

21. The device of claim 19 wherein said through hole axes are selectively oriented to establish an angle of forty-five degrees to ninety degrees between each through hole axis and said substrate face.

* * * * *